United States Patent [19]
Sweeney

[11] Patent Number: 5,135,402
[45] Date of Patent: Aug. 4, 1992

[54] SURFACE MOUNT LEADED CHIP CONNECTOR PLUG

[75] Inventor: Michael F. Sweeney, Beaverton, Oreg.

[73] Assignee: Intel Corporation, Santa Clara, Calif.

[21] Appl. No.: 706,762

[22] Filed: May 29, 1991

[51] Int. Cl.⁵ ............................................. H01R 9/09
[52] U.S. Cl. ..................... 439/71; 439/525; 174/52.4
[58] Field of Search ............ 439/70, 71, 72, 525, 439/526, 55, 65, 68; 174/52.4

[56] References Cited

U.S. PATENT DOCUMENTS

| | | | |
|---|---|---|---|
| 4,351,580 | 9/1982 | Kirkman et al. | 439/71 |
| 4,376,560 | 3/1983 | Olsson et al. | 439/70 X |
| 4,595,794 | 6/1986 | Wasserman | 439/71 X |
| 4,648,666 | 3/1987 | Lovell | 439/71 |
| 4,652,973 | 3/1987 | Baker et al. | 439/71 X |
| 4,682,829 | 7/1987 | Kunkle et al. | 439/70 |

Primary Examiner—Neil Abrams
Assistant Examiner—Khiem Nguyen
Attorney, Agent, or Firm—Blakely, Sokoloff, Taylor & Zafman

[57] ABSTRACT

A surface mount leaded chip connector plug for mating with a standard leaded chip connector socket is described. The plug includes an insulator having an outer circumference and a depth, and a multiplicity of electrical contacts disposed about the outer circumference. Each of the electrical contacts has a body and two arms. The body has a back side, a midline and two ends, and slopes inwardly from the ends toward the midline such that the body slidably locks with the leaded chip connector socket. One of the arms adjoins one of the body ends and the other of the arms adjoins the other of the body ends. Each of the arms extends toward the back side. The arms are separated by a distance greater than the insulator depth such that the electrical contact may be securely disposed about the insulator.

14 Claims, 4 Drawing Sheets

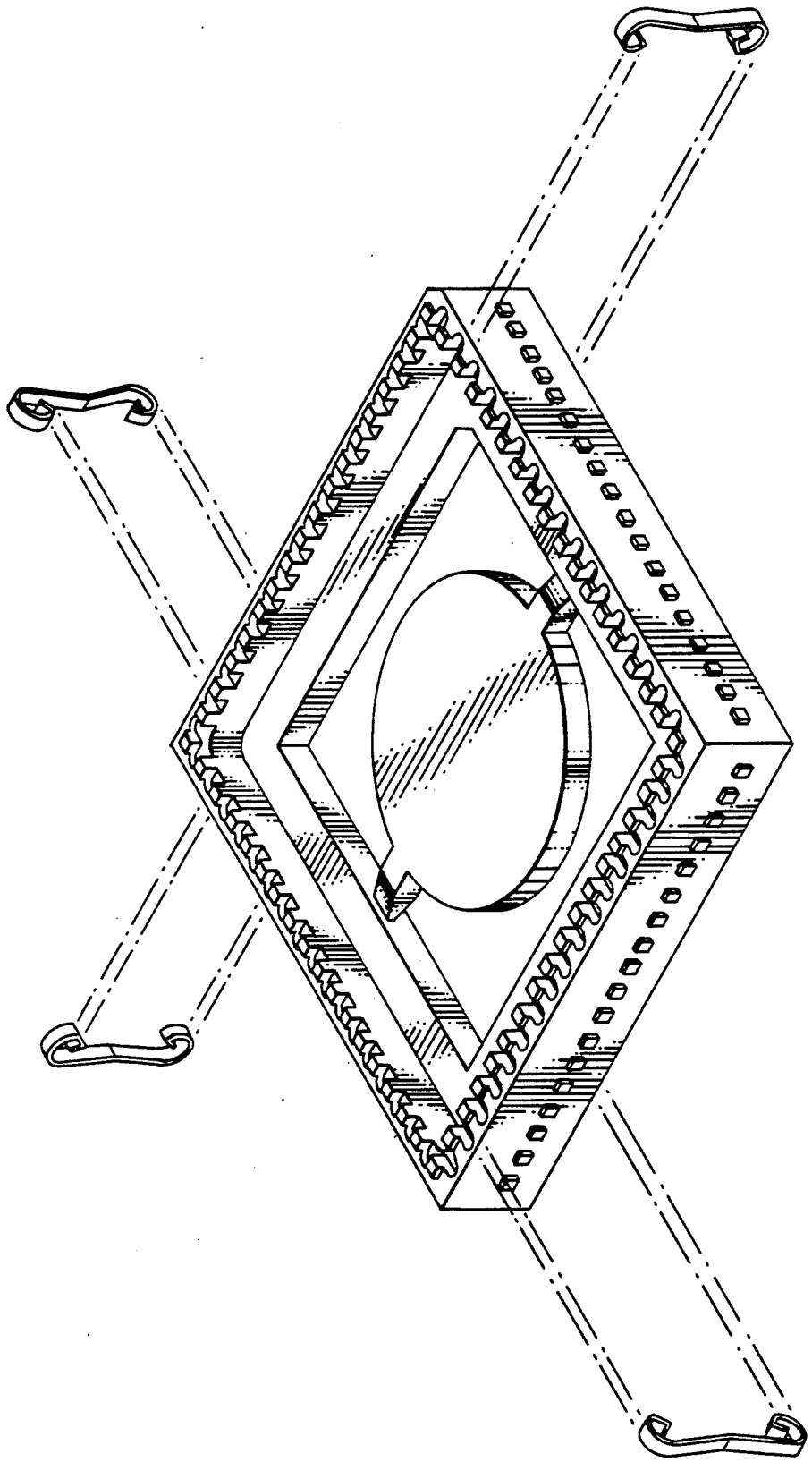
FIG_2

FIG_3
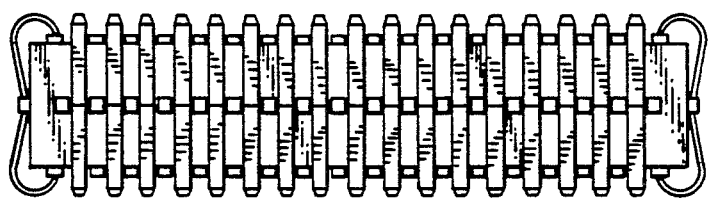
FIG_4
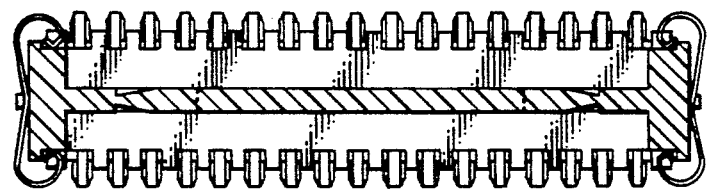
FIG_5
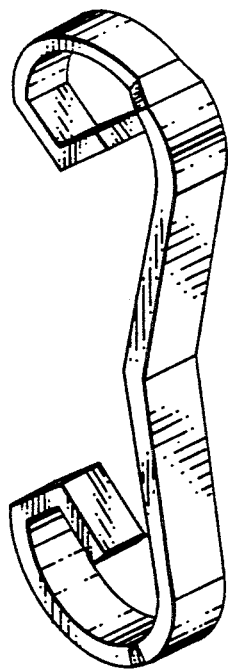
FIG_6
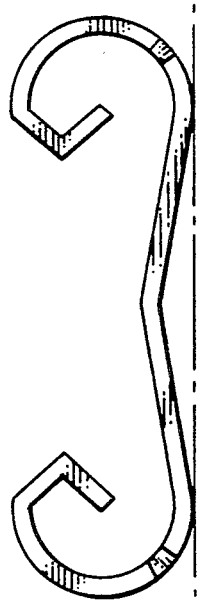

FIG_7 (PRIOR ART)
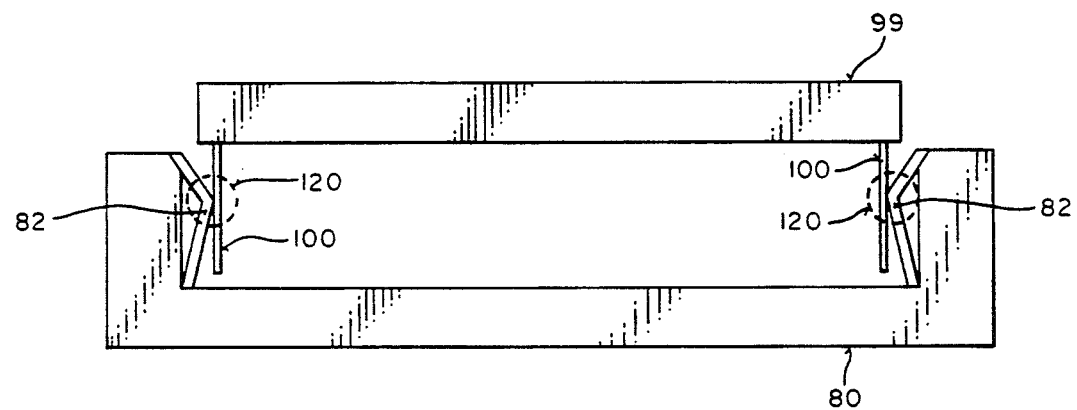
FIG_8
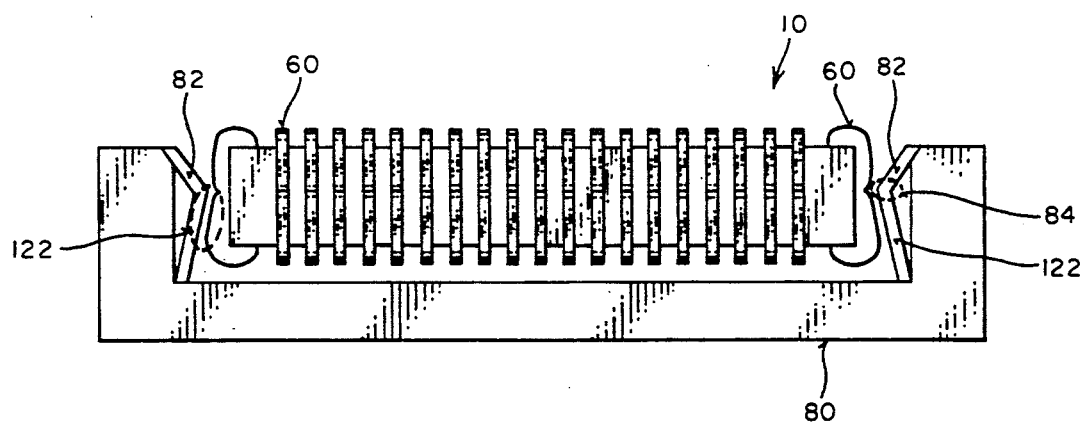

SURFACE MOUNT LEADED CHIP CONNECTOR PLUG

FIELD OF THE INVENTION

The present invention pertains to electrical connectors. More particularly, the present invention pertains to a surface mount electrical connector for use with circuit boards or integrated circuits.

BACKGROUND OF THE INVENTION

With integrated circuit boards there frequently exists a need to provide electrical connectors so that additional circuitry may be added in the future. For example, computer manufacturers frequently provide connections for additional memory boards or co-processors. Electrical sockets are a typical means of providing expandability.

Several prior electrical sockets exist for use in integrated circuit applications. In some applications, an integrated circuit is plugged directly into a socket. In other applications, a chip carrier connector plug carrying an integrated circuit board is plugged into a socket. One commonly available and well-known chip carrier plug is a plastic leaded chip carrier connector (PLCC) plug. A PLCC plug includes a plurality of electrical contacts, which may be plugged into a compatible socket.

PLCC plugs can suffer from several drawbacks. One common prior plug has straight contacts, as can be seen in FIG. 7. During insertion of the plug into the socket, the plug contacts can drive socket contacts beyond their elastic point. This phenomena is called overdrive. As a result of overdrive, electrical connections between the socket and the plug may be marginal, resulting in significant operational problems. Even in the absence of overdrive, electrical connections between the PLCC plug and the socket are less than ideal. Because the plug contacts are straight, the area of contact between the plug and the socket is a small diameter circle or point, as can be seen in FIG. 7. This small contact area creates a small electrical connection and results in impedance and reliability problems. Additionally, the straight contacts of the PLCC plug tend to cause it to vibrate out of the socket over time because the plug is held in place by the elastic action of the electrical contacts on the socket. For this reason, use of the straight contact plug is typically limited to testing operations of relatively short duration. Another drawback to the prior connector plug is its large size, which requires an excessively large area on a circuit board. The height of the prior plug may also render it unsuitable in some circuit board applications because of clearance problems in the circuit board card cage.

Thus, a better surface mount multiple pin connector plug for use on circuit boards or with integrated circuits is needed.

SUMMARY OF THE INVENTION

It is therefore an object of the present invention to provide a surface mountable chip carrier connector plug.

It is another object of the present invention to provide a chip carrier connector plug which may be installed on a circuit board by automated means.

It is a further object of the present invention to provide a chip carrier connector plug useful for circuit boards with active components on both sides of the circuit board.

It is a further object of the present invention to provide a chip carrier connector plug with a plurality of conducting pins shaped for locking the plug in a receiving socket.

It is a still further object of the present invention to provide a chip carrier connector plug with a plurality of conducting pins shaped for locking the plug in a receiving socket.

It is a still further object of the present invention to provide a chip carrier connector plug with a plurality of pins shaped for better electrical connections with a receiving socket.

It is a further object of the present invention to provide a chip carrier connector plug with minimal size and height in order to minimize the circuit board area necessary for use by the plug.

It is an object of the present invention to provide a chip carrier connector plug that is compatible with IPC standards for PLCC surface mount land patterns.

It is yet another object of the present invention to provide a chip carrier connector plug that is economically produced and easily assembled.

These and other objects are achieved with a surface mount leaded chip connector plug for mating with a standard leaded chip connector socket. The plug includes an insulator having an outer circumference and a depth, and a multiplicity of electrical contacts disposed about the outer circumference. Each of the electrical contacts has a body and two arms. The body has a back side, a midline and two ends, and slopes inwardly from the ends toward the midline such that the body slidably locks with the leaded chip connector socket. One of the arms adjoins one of the body ends and the other of the arms adjoins the other of the body ends. Each of the arms extends toward the contact back side. The arms are separated by a distance greater than the insulator depth such that the electrical contact may be securely disposed about the insulator.

Other objects, features, and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which references indicate similar elements and in which:

FIG. 2 is an exploded perspective view of the chip carrier connector plug showing how the plurality of conducting pins connect to the insulator;

FIG. 3 is a plan side view of the chip carrier connector plug of the present invention showing the external surface of the plug;

FIG. 4 a cut-a-way side view of the chip carrier connector plug showing the inside surface of the plug;

FIG. 5 is a perspective view of a contact;

FIG. 6 is a plan view a contact;

FIG. 7 is a side view of a prior connector plug inserted into a prior art socket;

FIG. 8 is a side view of a chip carrier connector plug of the present invention inserted into a socket.

DETAILED DESCRIPTION

Figure 1:
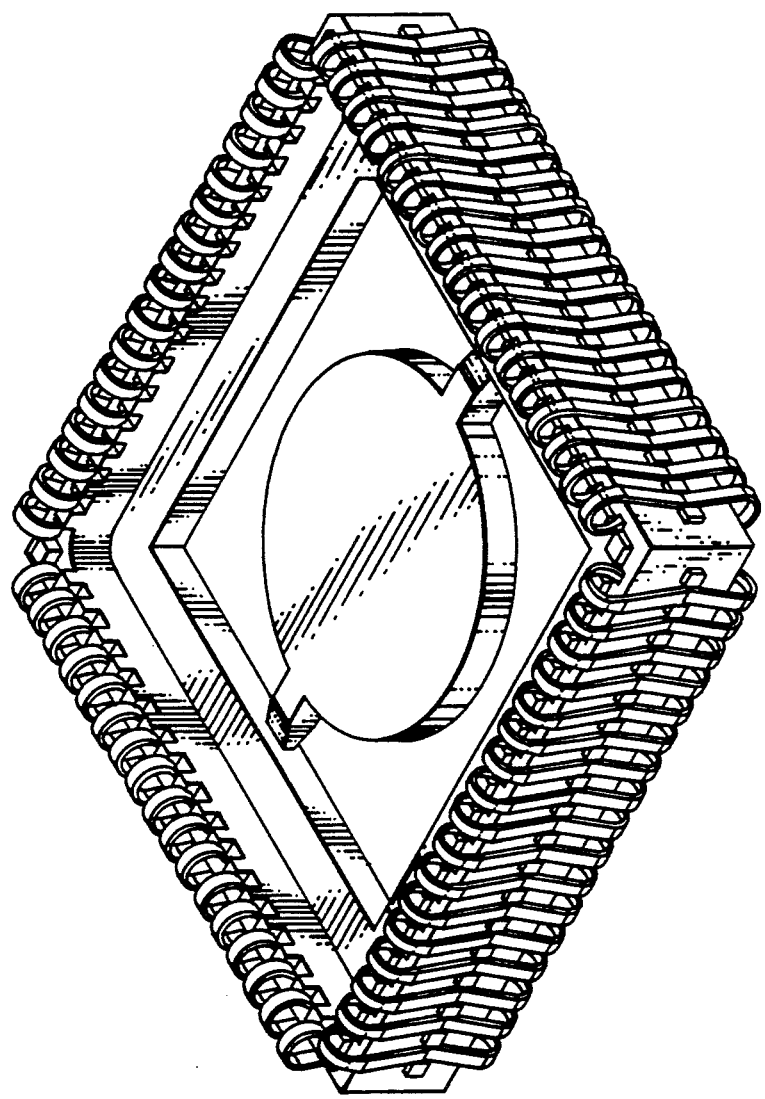
FIG. 1 is a perspective view of the chip carrier connector plug of the present invention.

In the following description, numerous specific details are set forth in order to provide a thorough understanding of the chip carrier connector plug. However, it will be apparent to one ordinary skilled in the art that these specific details need not be used to practice the present invention. In some instances, well-known structures and materials are not shown in detail to avoid unnecessarily obscuring the present invention.

FIG. 1 shows a perspective view of chip carrier connector plug 10, which is suited for use with integrated circuits. Plug 10 may be surface mounted to a circuit board and easily snapped into a receiving socket. The shape of plug contacts 60 ensure that plug 10 will not vibrate out of a receiving socket. A pad 29 incorporated into plug 10 allows the plug to be installed using automated means.

Connector plug 10 includes insulator frame 20 and sixty-eight conductive contacts 60. Insulator frame 20 provides a structure on which contacts 60 are mounted. Frame 20 insulates the contacts 60 from each other and guarantees that the contacts 60 are arranged in a configuration that is compatible with a receiving socket. Thus, it will be understood that the shape of frame 20 is constrained by the shape of the receiving socket. Contacts 60 provide multiple electrical connections between plug 10 and its receiving socket. The number of contacts 60 disposed about frame 20 is dictated by the receiving socket. Thus, it will be understood that a plug 10 having an arbitrary frame shape and an arbitrary number of contacts 60 may be constructed in accordance with the present invention.

Insulator frame 20 can be seen in more detail in FIG. 2. Insulator frame 20 is planar and generally square in shape. As shown, insulator frame 20 is approximately 1 inch×1 inch×0.25 inch; however, frame 20 can have any arbitrary dimensions. Frame 20 is of unitary construction and includes a body 22 adjoined by lip 24. Lip 24 extends perpendicularly from the surface of body 22.

Body 22 defines two openings 26a and 26b. Both openings 26a and 26b extend completely through body 22. Openings 26a and 26b define a substantially square perimeter 27 within the interior of body 22. Perimeter 27 is substantially concentric and congruent with body 22. Perimeter 27 forms three orthogonal corners; the fourth corner 28 is notched, allowing it to be used to determine the proper orientation of plug 10 during the surface mounting of a circuit board onto plug 10 or insertion of the plug 10 into a receiving socket.

Openings 26a and 26b are separated from each other by an island 29, or pad 29. As shown, island 29 is generally circular in shape, planar, with a depth slightly less than that of body 22. The diameter of island 29 is approximately 0.475 inches. Pad 29 attaches to body 22 via two opposed, generally rectangular tabs 30a and 30b. Pad 29 and its surrounding openings 26a and 26b permit plug 10 to be installed using automated means, such as a vacuum operated pick-and-place machine. Thus, it will be understood that island 29 and openings 26a and 26b may take any shape or dimensions that permits easy handling of plug 10 by automated means.

Lip 24 adjoins body 22 along its external perimeter. Because lip 24 extends beyond body 22 in all three dimensions, lip 24 determines the maximum dimensions of insulator 20. Lip 24 is substantially concentric and congruent with body 22. The perimeter of lip 24 is substantially square in shape and defines three orthogonal corners. The fourth corner 32 of lip 24 is notched, allowing plug 10 to be appropriately oriented prior to its insertion into a receiving socket or surface mounting of a circuit board.

Lip 24 is formed by four orthogonal walls 34, 36, 38, and 40. Each wall 34, 36, 38, and 40 includes a top face 42, a front face 44 and a bottom face 46. Each face 42, 44 and 46 is substantially rectangular in shape, with front faces 44 being larger in area than top faces 42 and bottom faces 46. Each top face 42 is approximately equal in size and located parallel to an associated bottom face 36. Every front face 44 adjoins both a top face 42 and a bottom face 46 at substantially right angles.

A multiplicity of regularly spaced teeth extend substantially perpendicularly from all three faces 42, 44, and 46 of each wall 34, 36, 38, and 40. Teeth 48 maintain regular spacing between contacts 60. Teeth 48 are aligned on the three faces 42, 44, and 46 such that all contacts 60 are held upright and parallel to each other.

Each tooth 48 on each face 42, 44 and 46 is spaced equidistantly from adjacent teeth 48. The distance between adjacent teeth 48 is such that a contact 60 can be easily snapped onto lip 24 and held securely in place. In other words, the distance between adjacent teeth 48 is slightly greater than the width of contacts 60. On front face 44, teeth 48 reside on a line located midway between the top face 42 and the bottom face 46. On the top face 42 and the bottom face 46, teeth 48 butt against the face edge farthest from front face 44.

Teeth 48 are substantially square in cross-section. Each tooth 48 is approximately 0.016 inches across and is located approximately 0.028 inches from adjacent teeth 48. Teeth 48 extend out approximately 0.010 inches from their associated face; i.e. the depth of teeth 48 is approximately 0.010 inches. The depth of teeth 48 need only be slightly greater than the depth of contacts 60 to prevent them from moving.

The number of teeth 48 on each face 42, 44, 46 on each wall 34, 36, 38, 40 depends upon the number of contacts 60 to be disposed about that wall. The number of teeth 48 on each face 42, 44, 46 should exceed the number of contacts 60 by two to securely hold contacts 60 in place. For the 68 contact PLCC plug 10 shown, 16 contacts are disposed about each wall 34, 36, 38, and 40; thus, each front face 44 of each wall 34, 36, 38, and 40 has 18 teeth. In contrast, each top face 42 and bottom face 46 has only 17 teeth. This is because the number of teeth 48 per face can be reduced by one where adjoining faces allow a tooth 48 to abut two contacts 60 disposed about two different, adjoining walls.

On the top and bottom faces 42 and 46, a number of notches 50 reside between adjacent teeth 48. Notches 50 help maintain contacts 60 securely about lip 24 without the use of mechanical or chemical fixatives, though such fixatives may be used if desired. Notches 50 are generally "U" shaped depressions in the surface of top faces 42 and bottom faces 46. The open ends of notches 50 abut the face edge furthest from front face 44. The closed ends of notches 50 extend toward but do not touch the face edge adjoining front face 44. The closed ends of notches 50 prevent contacts 60 from sliding off lip 24 once they are disposed about lip 24. The length of notches 50 is greater than the length of teeth 48. The depth of notches 50 is sufficient to seat contacts 60.

Insulator 20 is formed from a plastic, rhyton; however, any insulating material capable of withstanding the high temperatures of automated surface mounting processes can be used.

Contacts 60 form electrical connections between a circuit board mounted to plug 10 and a receiving socket. Thus, contacts 60 are formed from a conductive material. Any conductive material that can provide the required spring action may be used. Phoshor-bronze is used in the preferred embodiment. Contacts 60 may also be plated. In the preferred embodiment, contacts 60 are plated with tin-lead over nickel.

The structure of a contact 60 can be seen in FIGS. 5 and 6. Contact 60 is of unitary construction, resembling a moustache with curled ends. The structure of contacts 60 is substantially similar to the IPC specifications for terminal design of IC leads. Contact 60 is also compatible with IPC standards for PLCC surface mount land patterns for printed circuit boards. Contact 60 is approximately 0.254 inches in length, approximately 0.008 inches in depth and varies in width between approximately 0.026 inches and 0.018 inches.

Contact 60 includes a body 62 adjoined at either end by two opposed arms 64. Both contact 60 and body 62 are symmetrical about a midline 66, or waist 66. From its ends, to waist 66, body 62 slopes inwardly toward contact back 68 in a substantially linear fashion. If waist 66 in FIG. 6 defines an x-y origin (0,0), then the slope of body 62 is generally described by an equation of the form: $(x/m) = \|y\|$, where m is the slope.

Each opposed arm 64 adjoins an end of body 62, curling inwardly toward body back 68. Arm 64 describes a semi-circle from its juncture with body 62 to elbow 70, with a radius r of approximately 0.032 inches. The distance from the top 65 of one hemi-circle to the top 65 of the other hemi-circle is approximately 0.254 inches. The end of the hemi-circle forms elbow 70. The distance between elbows 70 is approximately 0.128 inches. The distance between elbows 70 is sufficient that contact 60 may be snapped onto lip 24 with elbows 70 lodged in associated notches 50 on a top face 42 and a bottom face 46, and remain securely in place. Contact 60 can be removed from lip 24 by applying force to contact 60.

At elbow 70, arm 64 extends linearly away from the hemicircle to wrist 72. Wrist 72 is closer to back 68 than elbow 70. The distance between wrist 72 and elbow 70 is approximately 0.023 inches. Arm 64 bends approximately 90° at wrist 72, extending linearly toward the juncture of body 62 and arm 64. Thus, it will be understood that tip 74 is closer still to back 68 than wrist 72, or elbow 70. The distance between wrist 72 and tip 74 is approximately 0.023 inches. The distance $L_2$ between the two arm tips 74 is approximately 0.174 inches. The distance $L_3$ between each tip 74 and its associated elbow 70 is approximately 0.045 inches.

Connector plug 10 is assembled by disposing the appropriate number of contacts 60 about insulator frame 20. In the preferred embodiment, contacts 60 are held in place by tension against frame 20. The closed ends of notches 50 prevent contacts 60 from coming off frame 20 without the application of more force than commonly encountered in integrated circuit board applications. However, mechanical or chemical fixative can be used to affix contacts 60 to frame 20 if so desired. Once snapped onto frame 20, teeth 48 maintain regular spacing between contacts 60.

After assembly, an integrated circuit board can be attached to plug 10 using surface mount techniques because contacts 60 are compatible the IPC standards for PLCC surface mount land patterns. Pad 29 allows plug 10 to be placed for surface mounting using a standard pick and place machine.

Once a circuit board or integrated circuit has been attached to plug 10, it can be snapped into a receiving socket. As shown in FIG. 8, the electrical connection between plug 10 and the receiving socket 80 is preferable to the connection between prior plug and receiving socket. The shape of contacts 60 complements the shape of socket contacts 82, bowing in where contacts 82 bow out. The complementary shape of contacts 60 maximizes the area of electrical connection 122 between plug contacts 60 and socket contacts 82. The complementary shape of contacts 60 slidably locks plug 10 into socket 80. Waists 66 rest adjacent to points 84 of contact 82. The increasing slope of body 62 away from waist 66 prevents contacts 60 from moving either up or down with respect to points 84. Thus, plug 10 is suited for integrated circuit applications other than testing because it will not vibrate out of a receiving socket over time.

Thus, a surface mount plastic leaded chip carrier connector plug has been described.

What is claimed is:

1. A leaded chip connector plug for mating with a leaded chip connector socket having socket electrical contacts, comprising:
   a) an insulator having an outer circumference and a depth; and
   b) a multiplicity of electrical contacts having a body and two arms, said body having a back side, a midline and two ends, said body sloping inwardly from said ends toward said midline such that said body slidably locks with one of the socket electrical contacts, one of said arms adjoining one of said ends and the other of said arms adjoining the other of said said ends, each of said arms extending toward said back side, said arms being separated by a distance greater than said insulator depth such that said electrical contact may be securely disposed about said insulator.

2. The leaded chip connector plug of claim 1 wherein said contacts are formed from phoshor bronze.

3. The leaded chip connector plug of claim 2 wherein said contacts are plated with tin-lead over nickel.

4. The leaded chip connector plug of claim 1 wherein said insulator is formed from plastic.

5. The leaded chip connector plug of claim 1 wherein said insulator includes a multiplicity of teeth extending from said outer circumference.

6. The leaded chip connector plug of claim 1 wherein said insulator includes a substantially planar body and a lip adjoining said body.

7. The leaded chip connector plug of claim 6 including teeth extending from said lip.

8. The leaded chip connector plug of claim 6 wherein said body defines two openings separated by an island.

9. The leaded chip connector plug of claim 7 wherein said island is large enough to be picked up by a pick and place machine.

10. A leaded chip connector plug for mating with a leaded chip connector socket having socket electrical contacts, comprising:
   a) an insulator having a body and a lip adjoining said body, said body defining two openings separated by an island, said island being large enough to be picked up by a pick and place machine, said lip having an outer circumference and a depth; and b) a multiplicity of electrical contacts disposed about said outer circumference, each of said electrical contacts having a body and two arms, said body having a back side, a midline and two ends, said body sloping inwardly from said ends toward said midline such that said body slidably locks with one of the socket electrical contacts, one of said arms adjoining one of said ends and the other of said arms adjoining the other of said ends, each of said arms extending toward said back side, said arms being separated by a distance greater than said insulator depth such that said electrical contact may be securely disposed about said insulator.

11. The leaded chip connector plug of claim 10 wherein said contacts are formed from phoshor bronze.

12. The leaded chip connector plug of claim 11 wherein said contacts are plated with tin-lead over nickel.

13. The leaded chip connector plug of claim 10 wherein said insulator is formed from plastic.

14. The leaded chip connector plug of claim 10 wherein said insulator includes a multiplicity of teeth extending from said outer circumference.

* * * * *

UNITED STATES PATENT AND TRADEMARK OFFICE
CERTIFICATE OF CORRECTION

PATENT NO. : 5,135,402
DATED : August 4, 1992
INVENTOR(S) : Michael F. Sweeney

It is certified that error appears in the above-indentified patent and that said Letters Patent is hereby corrected as shown below:

Column 5, line 26, delete "11y11" should read --1y1--.

Signed and Sealed this

Twentieth Day of June, 1995

Attest:

BRUCE LEHMAN

Attesting Officer

Commissioner of Patents and Trademarks